US007963679B2

(12) United States Patent
Liang

(10) Patent No.: US 7,963,679 B2
(45) Date of Patent: Jun. 21, 2011

(54) THERMAL MODULE ASSEMBLY

(75) Inventor: Chien-Kuo Liang, Taipei County (TW)

(73) Assignee: Aeon Lighting Technology Inc., Taipei County (TW)

( * ) Notice: Subject to any disclaimer, the term of this patent is extended or adjusted under 35 U.S.C. 154(b) by 605 days.

(21) Appl. No.: 12/026,135

(22) Filed: Feb. 5, 2008

(65) Prior Publication Data

US 2009/0195985 A1 Aug. 6, 2009

(51) Int. Cl.
*F21V 29/00* (2006.01)
*H05K 7/20* (2006.01)

(52) U.S. Cl. ........................................ 362/294; 362/373

(58) Field of Classification Search ........................ None
See application file for complete search history.

(56) References Cited

U.S. PATENT DOCUMENTS 7,670,021 B2 * 3/2010 Chou ............................ 362/148
2007/0230186 A1 * 10/2007 Chien ............................ 362/294

* cited by examiner

*Primary Examiner* — Jason Moon Han
*Assistant Examiner* — Sean P Gramling
(74) *Attorney, Agent, or Firm* — Rosenberg, Klein & Lee

(57) ABSTRACT

A thermal module assembly is applied to dissipate heat energy released from a lighting assembly when working, and comprises a plurality of heat-dissipating fins being chain-connected and a fixing ring. The heat-dissipating fins are radially extended from a central region, and each heat-dissipating fin comprises a fin body, a chain-connected mechanism and an extended folded plate. The chain-connected mechanism is located on an inner side of the fin body for chain-connecting the neighbor heat-dissipating fin, and the extended folded plate is located on an outer side of the fin body. The fixing ring hitches the outer side of each heat-dissipating fin, and the fixing ring is formed with a plurality of positioning folded plates along an inner ring edge thereof, so as to fix the extended folded plate and keep any two neighboring heat-dissipating fins in a unit pitch distance.

17 Claims, 10 Drawing Sheets

THERMAL MODULE ASSEMBLY

FIELD OF THE INVENTION

The present invention relates to a thermal module assembly, and more particularly to a thermal module assembly for dissipating heat energy released from a lighting assembly, wherein a plurality of positioning folded plate is applied to fix the heat dissipating fins and keep any neighboring two of the heat dissipating fins in a unit pitch distance.

BACKGROUND OF THE INVENTION

For the present illumination devices, they are usually assembled with a lighting assembly to project at least one illumination light beam to provide the function of illumination. In practice, the light emitting diodes (LEDs) can provide the performances of high power, high illumination, low power consumption and long life of use, so that the LEDs are usually applied to manufacture the illumination devices.

Actually, the LEDs also release heat energy when projecting illumination light beams to external environment. In the most conditions, if the heat energy can not be effectively dissipated, it not only influences the normal operation of the LED, but also decreases the life of use, and causes great decay of light; even more, it will make the LEDs be damaged soon. Therefore, the most illumination devices are usually assembled with a thermal module assembly, so as to increase the efficiency of heat dissipating through the improvement of the structure or the material of the thermal module assembly.

For raising the efficiency of heat dissipating, in structural, the thermal module assembly is usually designed with large surface area. However, it will make the overall structure of the thermal module assembly be more complicated if the surface area is increased. Thus, the manufacturing processes will become more complicated and, the yield rate will be become lower, and the manufacturing cost will also be increased. Under this background, the inventor has ever disclosed that a thermal module assembly can be manufactured by a plurality of heat dissipating fins arranged and fixed in a ring-distributed position.

Following up, a thermal module assembly provided by the inventor in previous will be further disclosed as a representative prior art. Please refer to FIG. 1 to FIG. 3 illustrating a method to manufacture the chain-connected type thermal module assembly in prior art, wherein FIG. 1 illustrates a thermal module assembly is composed of a plurality of heat dissipating fins and a fixing ring; FIG. 2 illustrates the heat dissipating fins arranging around a central axis in a ring-distributed position and being hitched by a fixing ring; and FIG. 3 illustrates that the fixing ring is compressed by an external force, and recessed toward the central axis to fix the heat dissipating fins. As shown in FIG. 1 to FIG. 3, a thermal module assembly 1 comprises a plurality of heat dissipating fins 11 being chain-connected, and each of the heat dissipating fins 11 comprises an extended folded plate 111. The heat dissipating fins 11 are arranged around a central axis A1 in a ring-distributed position. In other words, the heat dissipating fins 11 are radially extended from a central region C1 where the central axis A1 passes through.

The thermal module assembly 1 further comprises an inner fixing ring 12, and the bottom of the inner fixing ring 12 has an inner protrusion ring 121 protruded toward the central region C1. When assembling the thermal module assembly 1, firstly, it is necessary to make the heat dissipating fins 11 be arranged around a central axis A1 in a ring-distributed position, then it is necessary to make two ended ones of the heat dissipating fins 11 be adhered by tin soldering paste and fixed by reflow soldering, and make the fixing ring 12 hitch the outer side of all the heat dissipating fins 11. Following up, applying compressive forces on the fixing ring 12 with respect to the gaps between all neighboring two of the heat dissipating fins 11, so as to form a plurality of recessed structures 122. Hereafter, the recessed structures 122 and the inner protrusion ring 121 can fix the extended folded plates 111, so as to fix and position all the heat dissipating fins 11.

In practice, the heat dissipating fins 11 are usually made of aluminum alloy. For providing better performances in electrical insulation and antirust function, it is usually to execute an anodic treatment or an antirust treatment to form an anodic treatment layer or an antirust treatment layer on the surfaces of the heat dissipating fins 11. However, one who skilled in ordinary art can easily realize that there are four main problems existing in the prior art as mentioned.

First, due to that it is necessary to apply the compressive forces to the fixing ring 12, for ensuring that there will be no irregular deformation generating on the fixing ring 12 to influence the roundness of the fixing ring 12, it is further necessary to use more precision apparatus to apply the compressive forces, so as to increase the inconvenience of manufacturing.

Second, it is necessary to apply the compressive forces to the fixing ring 12 and ensure that there will be no irregular deformation generating on the fixing ring 12 to influence the roundness of the fixing ring 12. Thus, the fixing ring 12 shall be made of a material with sufficient hardness and malleability. In the prior arts, it is preferred to use white iron as the material with sufficient hardness and malleability; while, the environment conditions for executing the anodic treatment or the antirust treatment to the aluminum alloy is not suitable to execute such treatments to the white iron. Moreover, if the heat dissipating fins 11 are made of aluminum alloy, while the fixing ring 12 is made of white iron, the color of the heat dissipating fins 11 will be more obviously different from that of the fixing ring 12.

Third, due to that it is necessary to apply the compressive forces to the fixing ring 12, the roundness of the fixing ring 12 will be changed, even the change may be very slight. Therefore, the gaps between any neighboring two of the heat dissipating fins 11 will be not uniform. If the gap is too narrow, it will make the heat dissipating fins 11 be over tightened to generate unexpected deformation. On the contrary, if the gap is too wide, the heat dissipating fins 11 will become more loosening.

Fourth, due to that it is necessary to apply the compressive forces to the fixing ring 12, it is obvious that any neighboring two of the heat dissipating fins 11 will not keep in the same pitch distance. Therefore, the symmetry of the thermal module assembly 1 will be out of the predetermined requirement, and the appearance workmanship and overall performance of homogeneous heat conduction will also be out of the predetermined requirement.

SUMMARY OF THE INVENTION

From above description, in the prior arts, it is necessary to apply the compressive forces to the fixing ring, so that there are four problems existing thereof. First, it increases the inconvenience of manufacturing. Second, the heat dissipating fins and the fixing ring shall be made of different materials, so that it is necessary to execute the anodic treatment and the antirust treatment in different environment conditions. Third, if the gap between any neighboring two of the heat dissipating fins is too narrow or too wide, the unexpected deformation or the unexpected loosening will be generated. Fourth, the symmetry of the thermal module assembly 1 will be out of the predetermined requirement.

Thus, the primary objective of the present invention provides a thermal module assembly, in which a plurality of positioning folded plates are separately formed on an inner ring edge of a fixing ring to directly fix the heat dissipating fins and keep any two neighboring two of the heat dissipating fins in a unit pitch distance, so as to raise the arrangement symmetry of heat dissipating fins, and further to improve the performance of homogeneous heat conduction or heat dissipating and simplify the manufacturing processes.

The secondary objective of the present invention provides a thermal module assembly, in which a plurality of positioning folded plates are separately formed on an inner ring edge of a fixing ring to directly fix the heat dissipating fins. Therefore, it is not necessary to apply the compressive forces as mentioned, the heat dissipating fins and the fixing ring can be made of the same material, execute the anodic treatment or the antirust treatment together, so as to further simplify the manufacturing processes and keep well assembling conditions between the heat dissipating fins and the fixing ring.

Means of the present invention for solving the problems as mentioned above provides a thermal module assembly. The thermal module assembly is applied to dissipate heat energy released from a lighting assembly when working, and comprises a plurality of heat-dissipating fins being chain-connected and a fixing ring. The heat-dissipating fins are radially extended from a central region, and each heat-dissipating fin comprises a fin body, a chain-connected mechanism and an extended folded plate. The chain-connected mechanism is located on an inner side of the fin body for chain-connecting the neighbor heat-dissipating fin, and the extended folded plate is located on an outer side of the fin body. The fixing ring hitches the outer side of each heat-dissipating fin, and the fixing ring is formed with a plurality of positioning folded plates along an inner ring edge thereof, so as to fix the extended folded plate and keep any two neighboring heat-dissipating fins in a unit pitch distance.

In the preferred embodiment of the present invention, the heat dissipating fins and the fixing ring are made of aluminum alloy; therefore after the fixing ring hitches the heat dissipating the outer side of the heat dissipating fins, it is able to simultaneously execute the anodic treatment or the antirust treatment to the heat dissipating fins and the fixing ring to generate the anodic treatment layer or the antirust treatment layer, so as to provide well performance of electrical insulation and antirust. Meanwhile, after executing the anodic treatment or the antirust treatment, it is able to keep well assembling conditions between the heat dissipating fins and the fixing ring without unexpected deformation or loosening.

Form above description, comparing with the prior arts, in the present invention, a plurality of positioning folded plates are separately formed on the inner ring edge of the fixing ring; thus, it is able to directly fix the heat dissipating fins via the positioning folded plates, and keep any neighboring two of the heat dissipating plates keeping in the same unit pitch distance, so as to raise the homogeneity of heat conduction to improve the overall performance of heat dissipating, and further to save the cost of manufacturing.

Nevertheless, due to above reasons, the heat dissipating fins and the fixing ring can be made of the same material, and be treated via the anodic treatment or antirust treatment together to simplify the manufacturing processes. Thus, it is able to keep well connection conditions between the heat dissipating fins and the fixing ring to further save the cost of manufacturing and raise the yield rate of assembling the thermal module assembly. Additionally, due to above reasons, it is also to keep the smoothness of the appearance of the fixing without generating any recessed structures, and the heat dissipating fins and the fixing ring can be provided with the same color, so that the appearance workmanship of the thermal module assembly can be further improved.

The characteristics, and the preferred embodiment of this invention are described with relative figures as follows.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The technology of manufacturing the thermal module assembly as provided in accordance with the present invention can be widely use for manufacturing many kinds of thermal module assemblies of different illumination devices, the combined applications are too numerous to be enumerated and described, so that only one preferred embodiment capable of being positioned by two different positioning gauges is disclosed as follows for representation.

Figure 1:
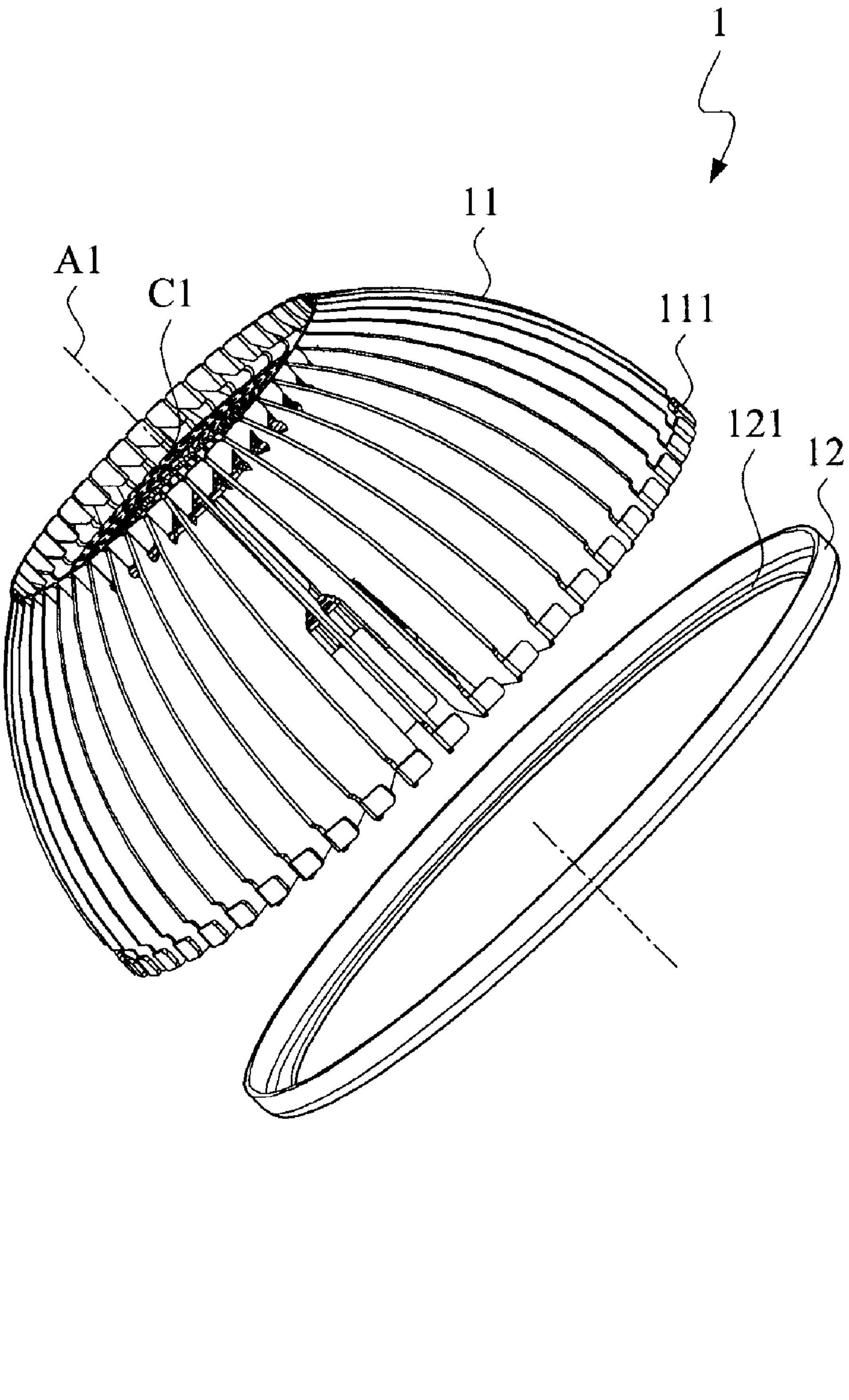
FIG.1(Prior Art)
FIG. 1 illustrates a thermal module assembly is composed of a plurality of heat dissipating fins and a fixing ring.
Figure 2:
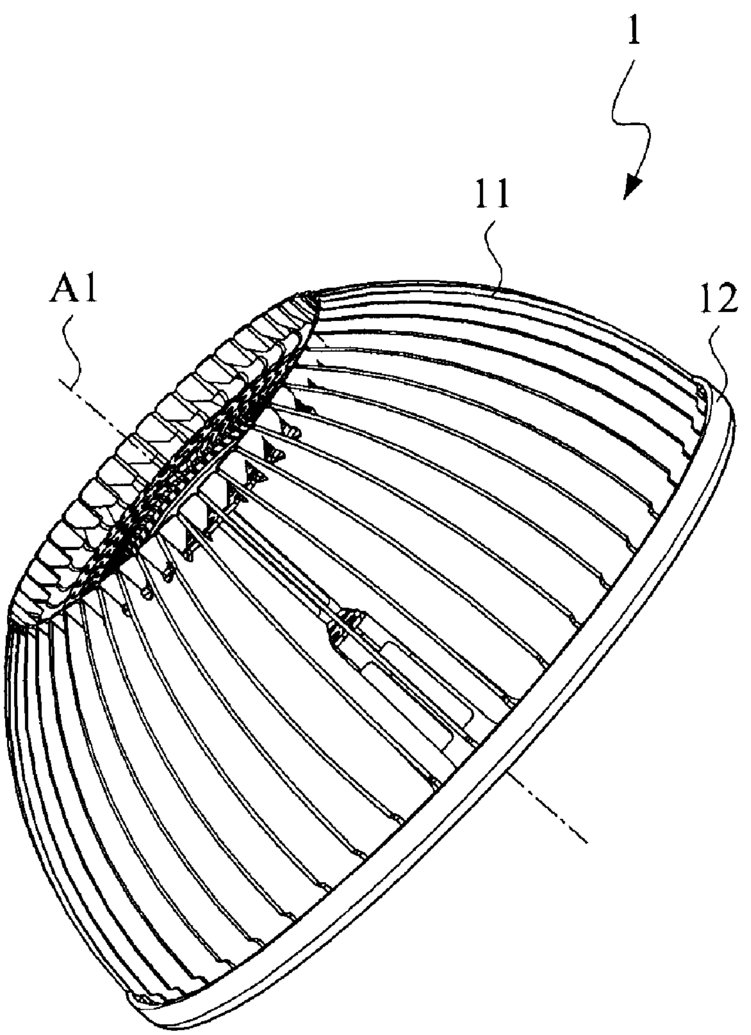
FIG.2(Prior Art)
FIG. 2 illustrates the heat dissipating fins arranging around a central axis in a ring-distributed position and being hitched by a fixing ring.
Figure 3:
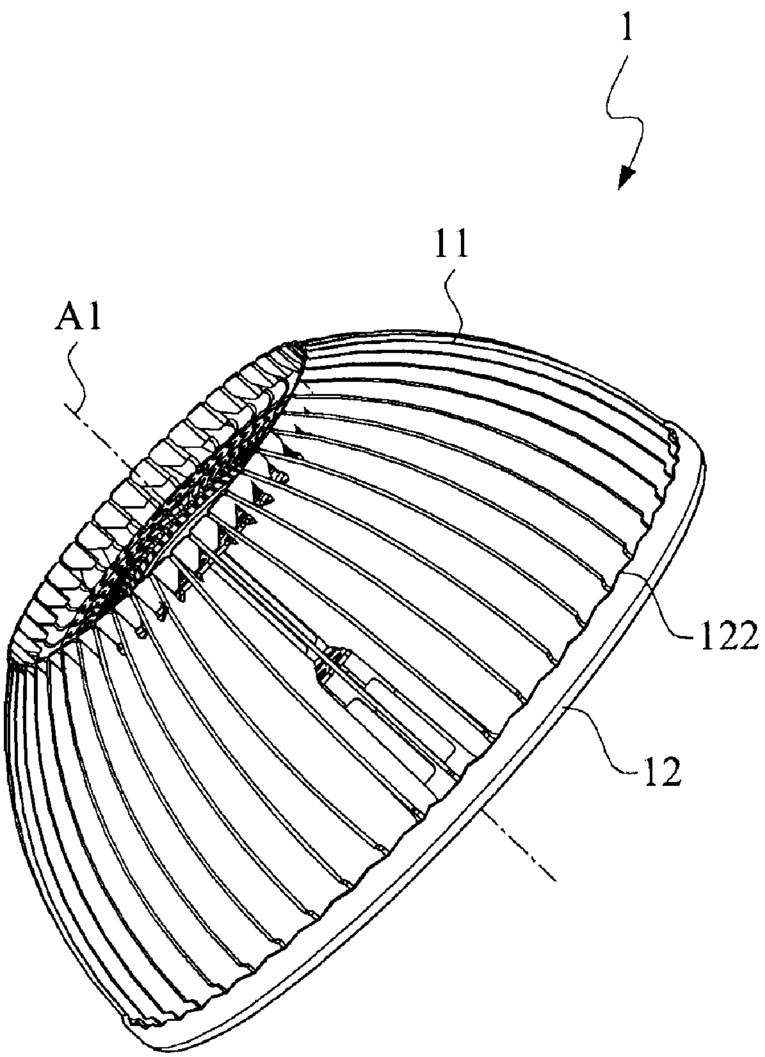
FIG.3(Prior Art)
FIG. 3 illustrates that the fixing ring is compressed by an external force, and recessed toward the central axis to fix the heat dissipating fins.
Figure 4:
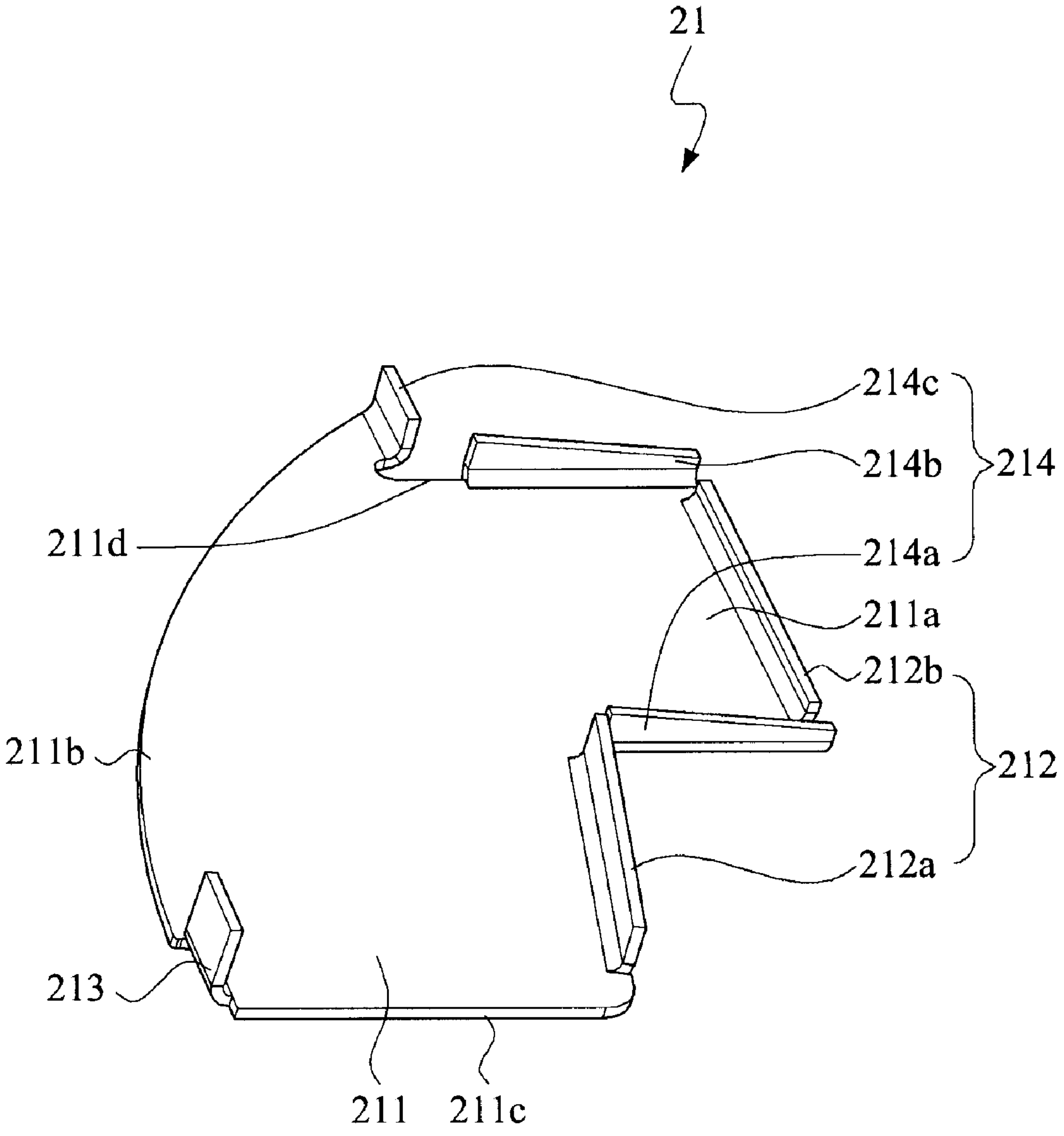
FIG. 4 illustrates the structure of a heat dissipating fin.
Figure 5:
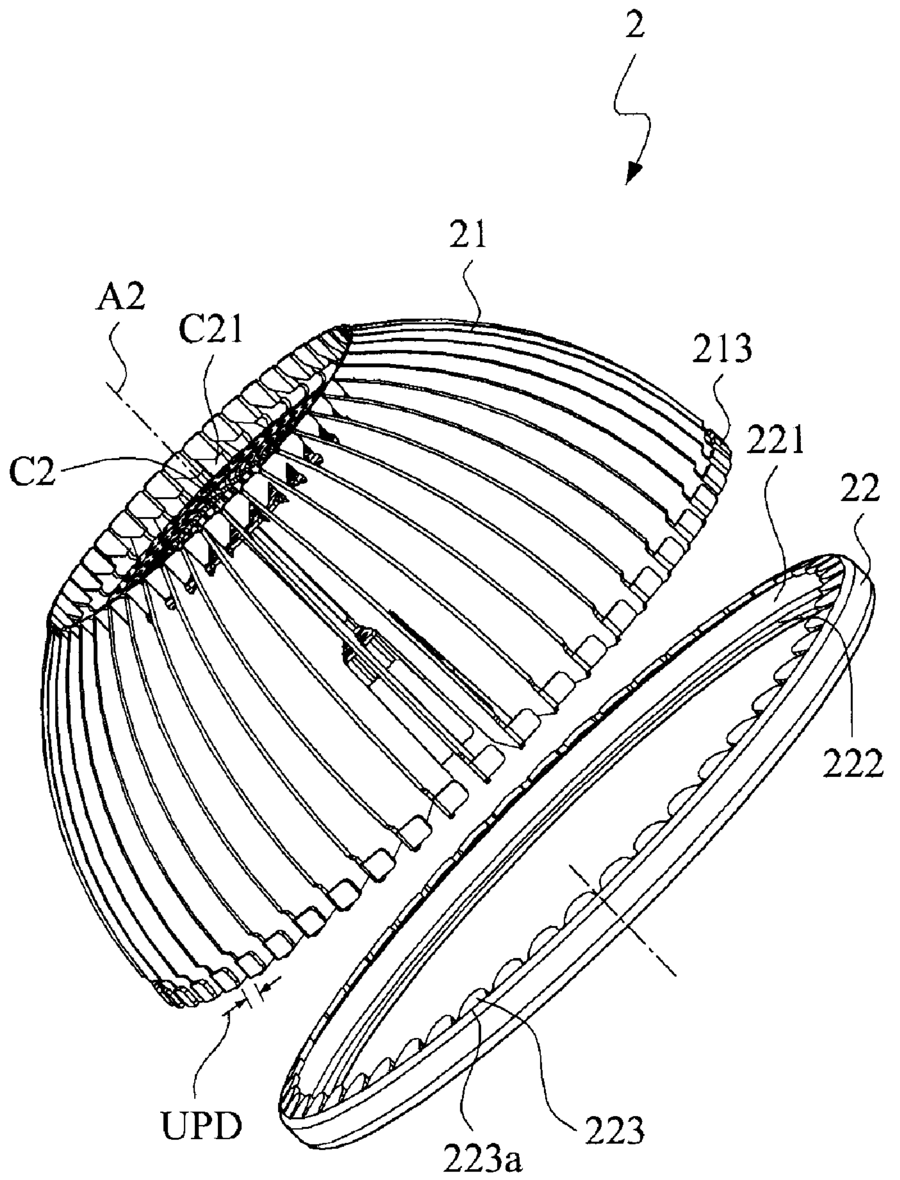
FIG. 5 illustrates thermal module assembly comprising a plurality of heat dissipating fins and a fixing ring in a preferred embodiment of the present invention.
Figure 6:
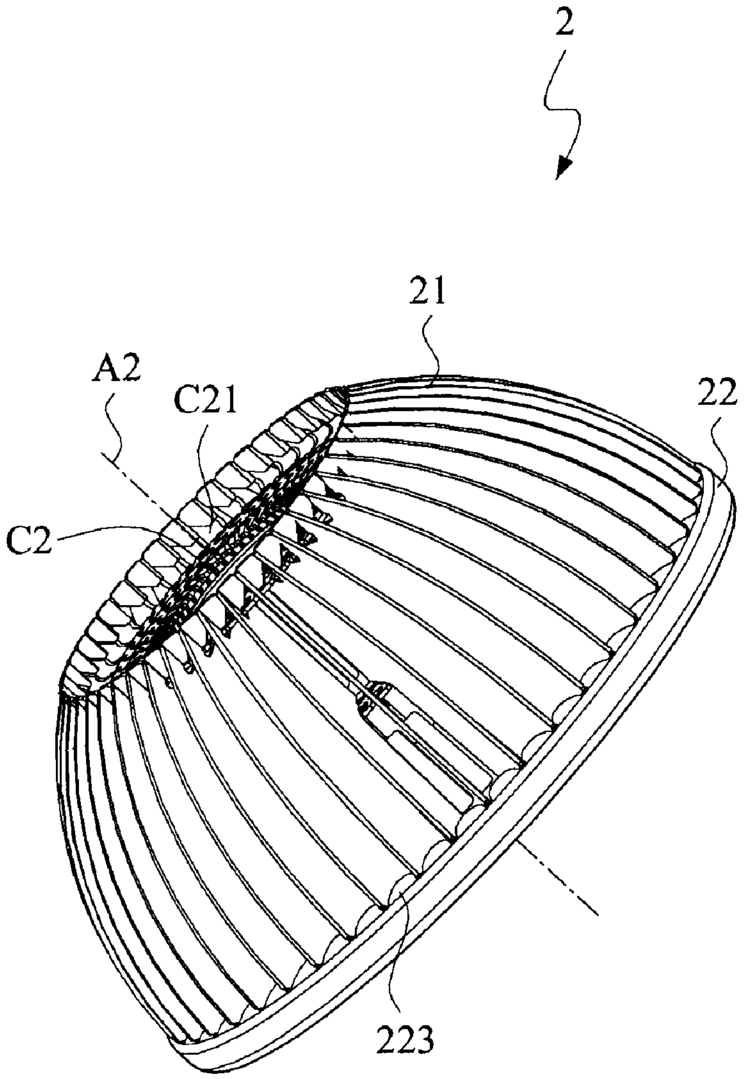
FIG. 6 illustrates the heat dissipating fins are arranged around a central axis in a ring-distributed position, and being hitched, positioned and fixed by a fixing ring in the preferred embodiment of the present invention.
Figure 7:
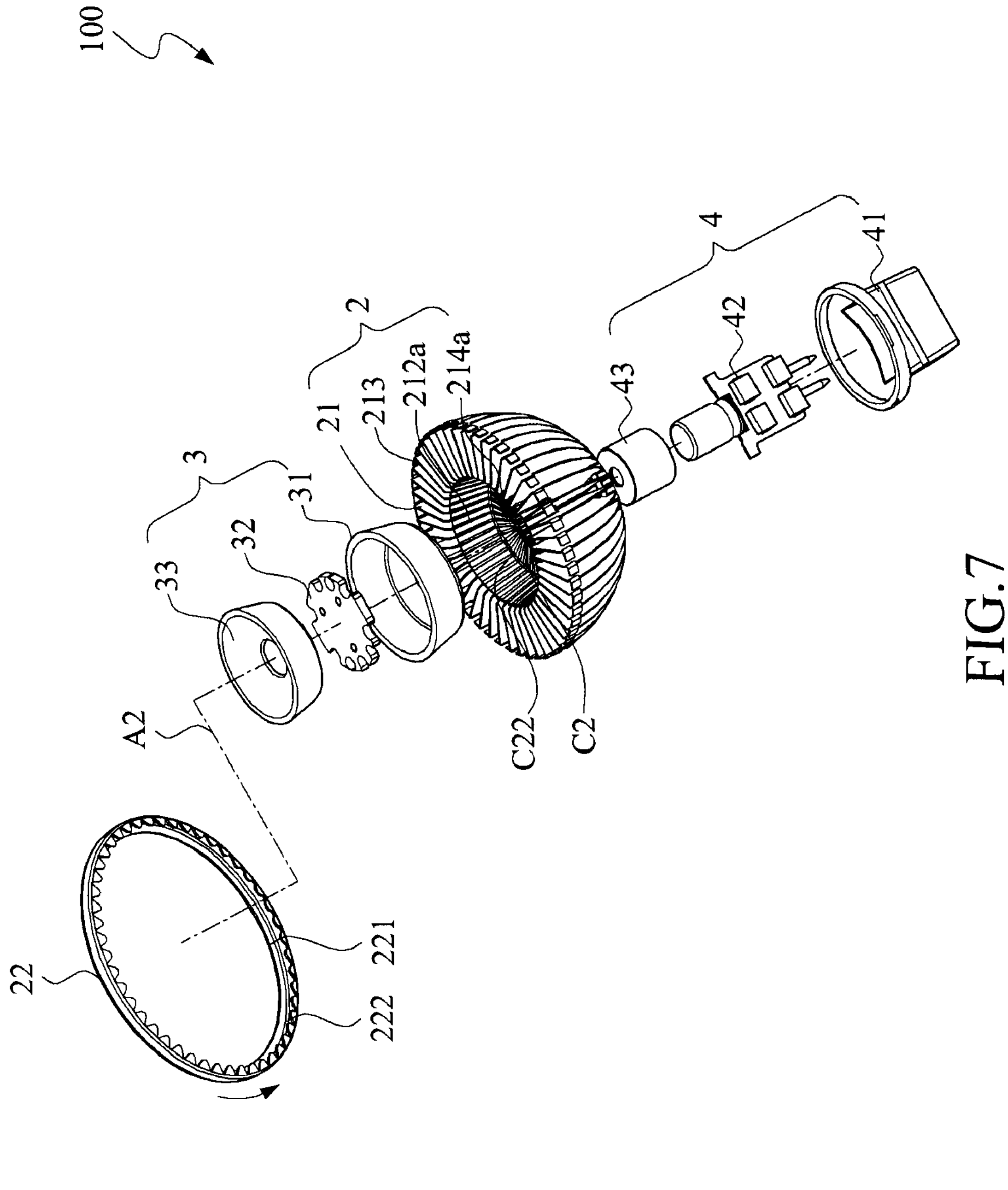
FIG. 7 illustrates the thermal module assembly is applied to assemble an illumination device in the preferred embodiment of the present invention.
Figure 8:
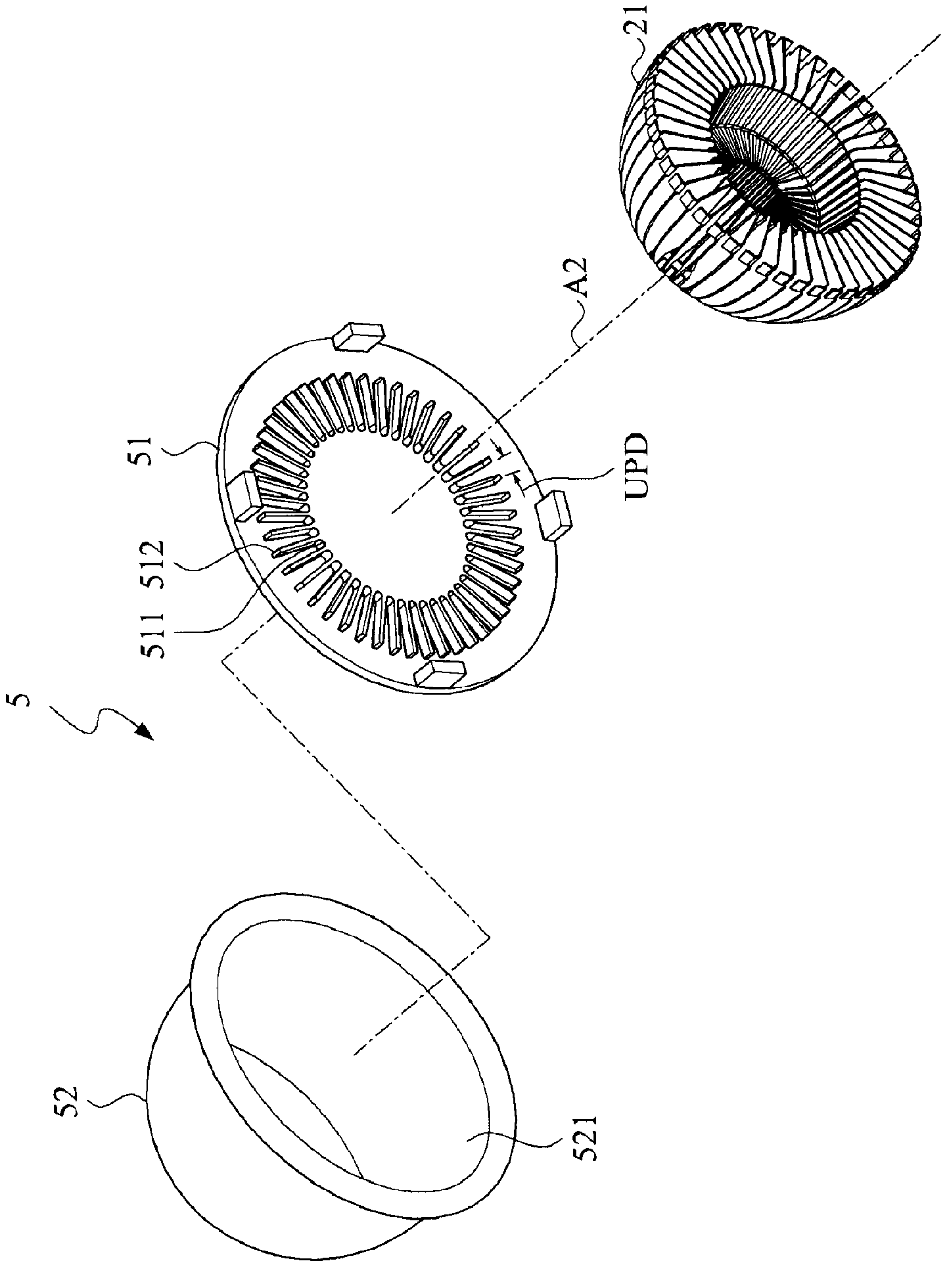
FIG. 8 illustrates a positioning gauge is applied to position heat dissipating fins in the preferred embodiment of the present invention.

Please refer to FIG. 4 to FIG. 8, wherein FIG. 4 illustrates the structure of a heat dissipating fin; FIG. 5 illustrates thermal module assembly comprising a plurality of heat dissipating fins and a fixing ring in a preferred embodiment of the present invention; FIG. 6 illustrates the heat dissipating fins are arranged around a central axis in a ring-distributed position, and being hitched, positioned and fixed by a fixing ring in the preferred embodiment of the present invention; FIG. 7 illustrates the thermal module assembly is applied to assemble an illumination device in the preferred embodiment of the present invention; and FIG. 8 illustrates a positioning gauge is applied to position heat dissipating fins in the preferred embodiment of the present invention.

AS shown in FIG. 4 to FIG. 8, a thermal module assembly is applied to be assembled to manufacture an illumination device 100, dissipate heat energy released from a lighting assembly 3 (shown in FIG. 7), and comprises a plurality of heat dissipating fins 21 being chain-connected together, and a fixing ring 22. The heat dissipating fins 21 are arranged around a central axis A2 in a ring-distributed position. In other words, the heat dissipating fins 21 are radially extended from a central region C2 where the central axis A2 passes through.

Each of the heat dissipating fins 21 comprises a fin body 211, a chain-connected mechanism, an extended folded plate 213 and a connection assembly 214. The fin body comprises an inner side 211*a*, an outer side 211*b*, a near side 211*c* and a far side 211*d*, wherein the inner side 211*a* neighbors to the central region C2; the outer side is away from the central region C2; the near side 211*c* connects with the inner side 211*a* and the outer side 211*b*, and neighbors to the lighting assembly 3; and the far side 211*d* connects to the inner side 211*a* and the outer side 211*b*, and locates far away from the lighting assembly 3.

The chain-connected mechanism 212 is located on the inner side 211*a*, so as to chain-connect neighbor two of the heat dissipating fins 21. Furthermore, the chain-connected mechanism comprises a first rail 212*a* and a second rail 212*b*, wherein the first rail neighbors to the near side 211*c*, and the second rail neighbors to the inner side 211*a*. The extended folded plate 213 is located on the outer side neighboring to the near side 211*c*. The connection assembly 214 comprises three connection plates 214*a*, 214*b* and 214*c*, wherein the connection plate 214 is located on the inner side 211*a*, and respectively connects to the first rail 212*a* and the second rail 212*b*; the connection plate 214*b* is located on the far side 211*d*, and connects to the second rail 212*b*; and the connection plate 214*c* is located on the outer side 211*b* and the boundary of the outer side 211*b* and the far side 211*d*.

The central region comprises a first region C21 and a second region C22. when the heat dissipating fins 21 are arranged around the central axis A2 in a ring-distributed position, the second rails 212*b*, the connection plates 214*b* and 214*c* of the heat dissipating fins 21 are arranged around the central axis A2 to form the first region C21. The first rails 212*a* and the connection plates 214*a* are arranged around the central axis A2 to form the second region C22.

The fixing ring 22 comprises a inner ring edge 221, an inner protrusion ring 222 and a plurality of positioning plates 223. The inner protrusion ring 222 is protruded toward the central region C2 from the bottom of the inner ring edge 221. The positioning folded plates 223 are separately formed on the top of the inner ring edge 221, and each of the positioning folded plates 223 is folded toward the central region C2 along a preset folded line 223*a*.

When assembling the illumination device 100, the lighting assembly is assembled to the second region C22 of the central region C2, i.e., the lighting assembly 3 is assembled near the near side 211*c*. Then, assemble a power supplying assembly 4 to the first region C21 of the central region C2, and make the power supplying assembly 4 be electrically connected to the lighting assembly 3 within the first region C21 of the central region C2, i.e., make the power supplying assembly 4 be assembled near the far side 211*d*.

The lighting assembly comprises a light cup 31, a light emitting diode (LED) 32 and a reflection cup 33, wherein the light cup 31 is assembled to the second region C22 of the central region C2; the LED 32 is deposited on the light cup 31, the reflection cup 33 is assembled neighbor to the LED 32. The power supplying assembly 4 comprises a plastic shell 41, a power supplying member 42 and a heat conduction cylinder 43, wherein the power supplying member 42 is assembled in the plastic shell 41, the heat conduction cylinder 43 can be a heat conductor and installed with conductive wire, so as to electrically connect to the lighting assembly 3 and the power supplying member 42 within the first region C21 of the central region C2. Therefore, when the power supplying member 42 connects to an external power to provide electricity to the LED 32, the LED can project illumination light beam to the external environment, and the heat energy release from the LED can be dissipated by the thermal module assembly 2.

Following up, a manufacturing technology of the thermal module assembly 2 will be further disclosed. Before disclosing the manufacturing technology, it is necessary to disclose a special positioning gauge. As shown in FIG. 8, a positioning gauge 5 comprises a positioning ring 51 and a cover 52. The positioning ring 5 has an inner position edge 511 and a plurality of positioning indentations 512 separately arranged along a preset arrangement position located in the inner positioning edge 511, and any neighboring two of the positioning indentations 512 are kept in a unit pitch distance UPD. In the preferred embodiment, the preset arrangement position is a ring-distributed position. The cover 52 comprises a cave 521.

When manufacturing the thermal module assembly 2, it is necessary to arrange the heat dissipating fins 21 being chain-connected around the central axis A2 in the ring-distributed position, and anoint the most ended two of the heat dissipating fins 21 with aluminum paste. Then, hitch the outer side 211*b* of the heat dissipating fins 21 by the positioning ring 51, and make the heat dissipating fins 21 respectively insert into the positioning indentations 512 to position the heat dissipating fins 21. Meanwhile, the heat dissipating fins 21 are also arranged along the ring-distributed position, and any neighboring two of the heat dissipating fins 21 can be kept in the same unit pitch distance UPD. Thus, it is able to raise the homogeneity of heat conduction and further improve the overall performance of heat dissipating.

Following up, cover the cover 52 to the positioning ring 52 to make the cave 521 of the cover 52 and the positioning further position the heat dissipating fins 21, and put the heat dissipating fins 21 and the positioning gauge 5 into a reflow soldering oven to execute a reflow soldering treatment to fix the heat dissipating fins 21. Then, hitch the outer sides 211*b* of the heat dissipating fins 21 (after executing the reflow soldering treatment) with the fixing ring 22, so that the inner protrusion ring 222 and the positioning folded plates 223 can effectively fix the extended folded plates 213 of the heat dissipating fins 21 to firmly fix the heat dissipating fins 21.

Next, execute the anodic treatment or the antirust treatment (such as nickel-plated), so as to respectively generate an anodic treatment layer and an antirust treatment layer. In the preferred embodiment, the heat dissipating fins 21 and the fixing ring 22 can be made of a metal material, a non-metallic material or the combination, in the preferred embodiment, the aluminum alloy is more preferable. When the heat dissipating fins 21 and the fixing ring 22 are made of aluminum alloy, after executing anodic treatment, the surfaces of the heat dissipating fins 21 and the fixing ring 22 are composed of aluminum oxide ($Al_2O_3$), so as to provide well performance of electrical insulation and antirust.

Moreover, due to that the heat dissipating fins 21 and the fixing ring 22 are firmly assembled, when executing the anodic treatment or the antirust treatment to the heat dissipating fins 21 and the fixing ring 22, the overall deformations of the heat dissipating fins 21 and the fixing ring 22, no matter generated from temperature variation or the anodic treatment or the antirust treatment, will be very close to each other. From above descriptions, after executing the anodic treatment, the heat dissipating fins 21 and the fixing ring 22 still can keep well connection conditions without unexpected deformation or loosening.

Figure 9:
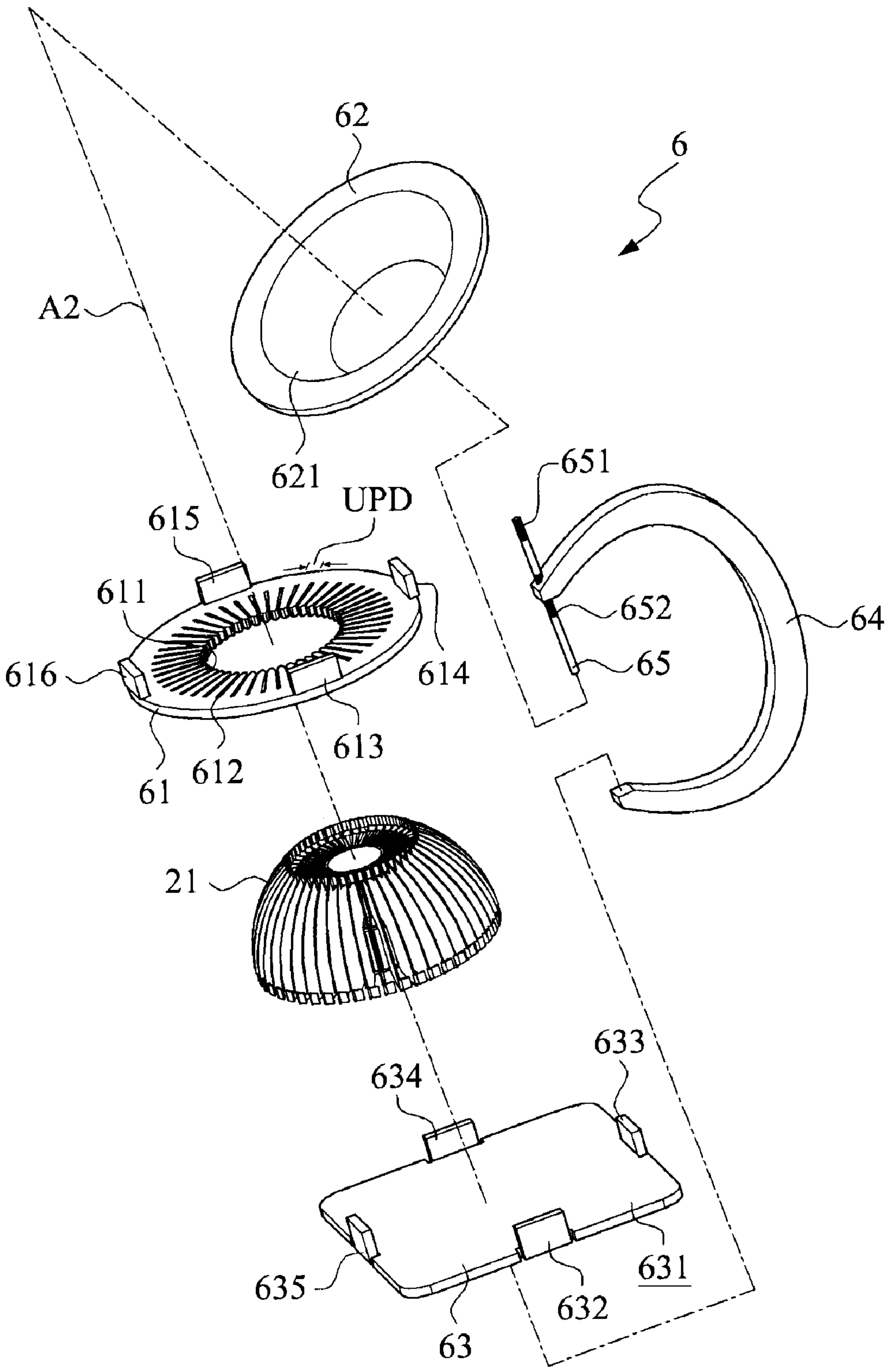
FIG. 9 illustrates another positioning gauge also can be applied to position the heat dissipating fins in accordance with the preferred embodiment of the present invention.
Figure 10:
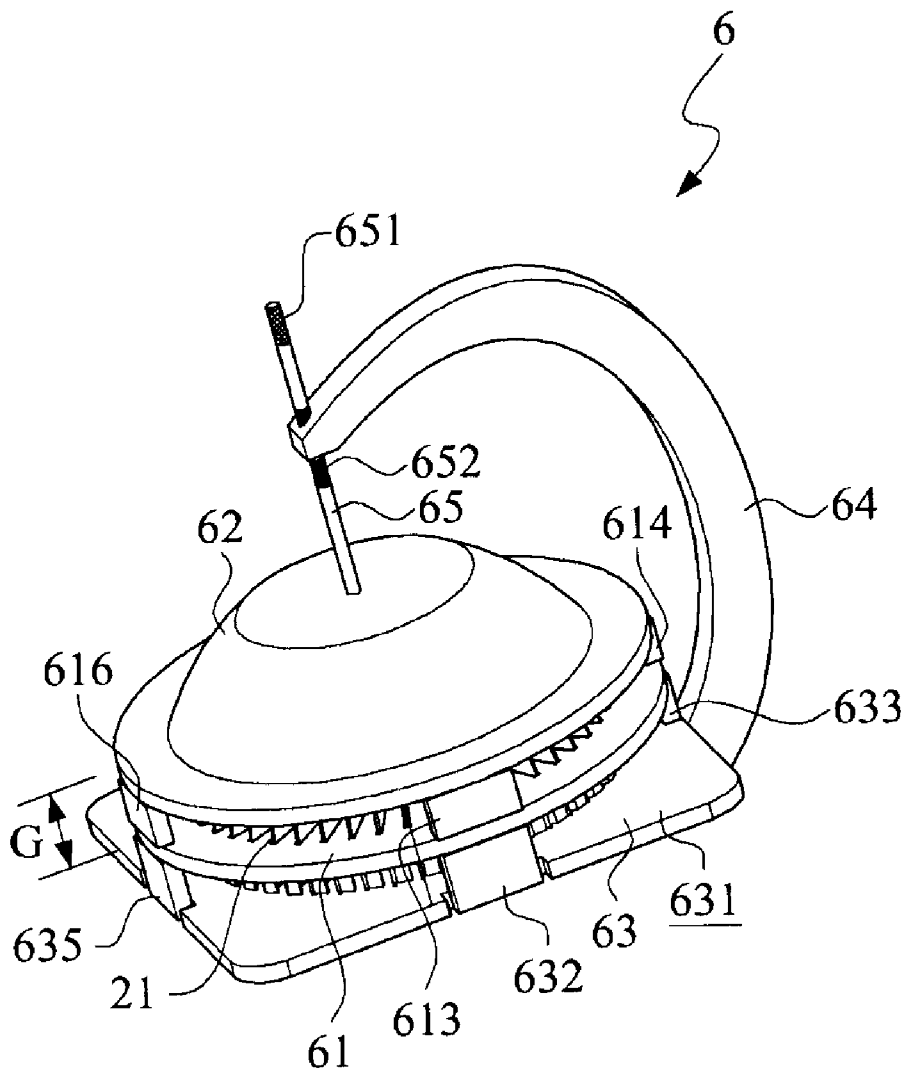
FIG. 10 illustrates the positioning gauge positioning the heat dissipating fins in accordance with the preferred embodiment of the present invention.

Finally, please further refer to FIG. 9 and FIG. 10, wherein FIG. 9 illustrates another positioning gauge also can be applied to position the heat dissipating fins in accordance with the preferred embodiment of the present invention; and FIG. 10 illustrates the positioning gauge positioning the heat dissipating fins in accordance with the preferred embodiment of the present invention. Simultaneously, please also refer to FIG. 4 to FIG. 7. As shown in the mentioned figures, a positioning gauge 6 comprises a positioning ring 61, a cover 62, a base 63, a curved arm 64 and an adjustment member 65.

The positioning ring 6 has an inner position edge 611 and a plurality of positioning indentations 612 separately arranged along a preset arrangement position located on the inner positioning edge 611, and any neighboring two of the positioning indentations 512 are also kept in the unit pitch distance UPD. In the preferred embodiment, the preset arrangement position is a ring-distributed position. Moreover, the fixing ring 61 further has four position-limited members 613, 614, 615 and 616 protruding toward the cover 62. The cover 62 comprises a cave 621.

The base 63 is installed with respect to the location of the positioning ring 61, has four position-limited members 632, 633, 634 and 635 protruding toward the positioning ring 61. Meanwhile, the base 63 is away from the cover 62 by a distance-limitation gap G. In the preferred embodiment of the present invention, the curved arm 64 is a C shaped arm with two ends respectively neighboring to the cover 62 and the base 63, so as to constrain the heat-dissipating fins 21 between the cover 62 and the base 63. The adjustment member 65 comprises an operation section 651 and a screwed section 652. The operation section 651 can be embossed with net-distributed pattern, so as to be operated conveniently; and the screwed section 652 is connected to one end of the curved arm 64 by screwing.

Obviously, although in FIG. 9 and FIG. 10, the screwed section 652 is connected to one end of the curved arm 64 neighbor to the cover 62, in practice, the screwed section 652 also can be connected to the other end of the curved arm 64 neighbor to the base 63.

When manufacturing the thermal module assembly 2, the positioning function provided by the positioning gauge 6 is similar to that provided by the positioning gauge 5. There are two major differences between the positioning gauges 5 and 6, one major difference is that the positioning gauge 6 has the base 63, curved arm 64 and the adjustment member 65, so that the distance of the distance-limitation gap G can be adjusted uniformly.

The other major difference is that the existing of the position-limited members 613, 614, 615, 616, 632, 633, 634, 635 can limit the smallest distance of the distance-limitation gap G, so as to prevent the heat dissipating fins from unexpected deformation if the distance of the distance-limitation gap G is too small.

After reading above disclosure, one who skilled in ordinary arts can easily realize that the positioning folded plates 223 separated arranged on the inner ring edge 221 of the fixing ring not only can directly fix the heat dissipating fins 21, but also can keep any neighboring two of the heat dissipating fins 21 in the same unit pitch distance UPD, so as to improve the symmetry of the arrangement of the heat dissipating fins 21 and save the cost of manufacturing.

Furthermore, the heat dissipating fins 21 and the fixing ring 22 can be made of the same metal material, non-metallic material or the combination. Especially, in the preferred embodiment of the present invention, the heat dissipating fins 21 and the fixing ring 22 are made of aluminum alloy and able to be treated by the anodic treatment and the antirust treatment together. Therefore, it is able to simplify the anodic treatment or the antirust treatment process, keep well connection conditions to further save the cost of manufacturing and raise the yield rate of assembling the heat dissipating fins 21 and the fixing ring 22. Additionally, due to above reasons, it is able to keep the smoothness of the appearance of the fixing ring (without the recessed structure 122 as mentioned in prior art), and keep the heat dissipating fins 21 and the fixing ring 22 being provided with the same color to perform well appearance workmanship.

Nevertheless, through the technology as mentioned above, the heat dissipating fins 21 can be arranged with better symmetry; hence, the thermal module assembly 2 can provide homogeneous heat conduction function to improve overall performance of heat dissipating.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A thermal module assembly for dissipating a heat energy from a lighting assembly, comprising:
- a plurality of heat dissipating fins being chain-connected, and radially extending from a central region, each of the chain-connected heat dissipating fins comprising:
  - a fin body being substantially planar in contour, comprising:
    - an inner side section adjacent to the central region; and
    - an outer side section radially displaced from the central region;
  - a chain-connected mechanism located in the inner side section of the fin body for chain-connecting adjacent ones of the chain-connected heat dissipating fins; and
  - an extended folded plate located in the outer side section of the fin body extending out of the plane of the fin body; and
- a fixing ring having an inner ring edge, for coupling the outer side section of each of the chain-connected heat dissipating fins to the fixing ring, and comprising:
  - a plurality of positioning folded plates, each of said positioning folded plates corresponding to the extended folded plate of a corresponding one of the fin bodies; each of the positioning folded slates being separately formed along the inner ring edge, whereby the extended folded plate of each of the chain-connected heat dissipating fins is coupled to a corresponding positioning folded plate for maintaining adjacent dissipating fins of the chain-connected heat dissipating fins in a unit pitch distance a art from each other.

2. The thermal module assembly as claimed in claim 1, wherein the fixing ring further comprises an inner protrusion ring protruded from the inner ring edge toward the central region, so as to assist the extended folded plate to fix the chain-connected heat dissipating fins together.

3. The thermal module assembly as claimed in claim 1, wherein the positioning folded plate is folded toward the central region along a preset folded line.

4. The thermal module assembly as claimed in claim 1 wherein the fin body further comprises:

a near side connecting to the inner side and the outer side, and being neighbor to the lighting assembly; and a far side connecting to the inner side and the outer side, and being far away from the lighting assembly.

5. The thermal module assembly as claimed in claim 4, wherein the far side is neighbor to a power supplying assembly.

6. The thermal module assembly as claimed in claim 1 wherein the fin body is made of a metal material.

7. The thermal module assembly as claimed in claim 6, wherein a surface of the fin body is manufactured by executing an anodic treatment to the metal material.

8. The thermal module assembly as claimed in claim 6, wherein a surface of the fin body is manufactured by executing an antirust treatment to the metal material.

9. The thermal module assembly as claimed in claim 6, wherein the metal material is an aluminum alloy, and a surface of the fin body is composed of aluminum oxide ($Al_2O_3$), which is generated by executing an anodic treatment to the aluminum alloy.

10. The thermal module assembly as claimed in claim 6, wherein the fin body is made of a non-metallic heat-dissipating material.

11. The thermal module assembly as claimed in claim 1, wherein the fixing ring is made of a metal material.

12. The thermal module assembly as claimed in claim 11, wherein the metal material is an aluminum alloy, and a surface of the fin body is composed of aluminum oxide ($Al_2O_3$), which is generated by executing an anodic treatment to the aluminum alloy.

13. The thermal module assembly as claimed in claim 1, wherein the fixing ring is made of a non-metallic heat-dissipating material.

14. The thermal module assembly as claimed in claim 1, further being positioned by a positioning gauge, so as to make the chain-connected heat-dissipating fins be positioned in a preset arrangement position and further be fixed by the fixing ring, wherein the positioning gauge comprises:

a positioning ring forming with an inner positioning edge, and comprising:

a plurality of positioning indentations arranged along the preset arrangement position located in the inner positioning edge, and making any neighboring two of the positioning indentations being separated in the unit pitch distance, so as to provide for the heat dissipating fins to be inserted in and positioned.

15. The thermal module assembly as claimed in claim 14, wherein the positioning gauge further comprises a cover forming with a cave, so as to further position the heat dissipating fins when the cover matches to the positioning ring to make the heat dissipating fins be constrained by the cave.

16. The thermal module assembly as claimed in claim 15, wherein the positioning gauge further comprises:

a base being installed with respect to the positioning ring, and keep in a position-limitation gap away from the cover;

a curved arm with two ends respectively neighboring to the cover and the base, so as to constrain the heat-dissipating fins between the cover and the base; and an adjustment member connected to the curved arm, so as to adjust the position-limitation gap.

17. The thermal module assembly as claimed in claim 16, wherein adjustment member is connected to the curved arm by screwing.

* * * * *